(12) United States Patent
Jeon et al.

(10) Patent No.: US 7,940,220 B2
(45) Date of Patent: May 10, 2011

(54) CASE STRUCTURE HAVING CONDUCTIVE PATTERN AND METHOD OF MANUFACTURING THE SAME

(75) Inventors: Dae Seong Jeon, Gyunggi-do (KR); Sang Woo Bae, Gyunggi-do (KR); Jae Suk Sung, Gyunggi-do (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 285 days.

(21) Appl. No.: 12/185,341

(22) Filed: Aug. 4, 2008

(65) Prior Publication Data

US 2009/0051602 A1    Feb. 26, 2009

(30) Foreign Application Priority Data

Aug. 22, 2007  (KR) .................... 10-2007-0084429

(51) Int. Cl.
*H01Q 1/24*      (2006.01)

(52) U.S. Cl. ........................ 343/702; 343/873

(58) Field of Classification Search .................. 343/872, 343/873, 702, 700 MS
See application file for complete search history.

(56) References Cited

U.S. PATENT DOCUMENTS

| | | | | |
|---|---|---|---|---|
| 6,215,454 | B1 * | 4/2001 | Tran ............................... | 343/841 |
| 7,482,983 | B2 * | 1/2009 | Chang et al. .................... | 343/702 |
| 2006/0290575 | A1 * | 12/2006 | Pelzer ........................... | 343/702 |

FOREIGN PATENT DOCUMENTS

KR    1020060062955 A    6/2006

* cited by examiner

*Primary Examiner* — Tho G Phan
(74) *Attorney, Agent, or Firm* — Lowe Hauptman Ham & Berner LLP

(57) ABSTRACT

There is provided a case structure having a conductive pattern and a method of manufacturing the same. A case structure having a conductive pattern according to an aspect of the invention includes a case having at least one via hole formed therein; at least conductive pattern formed on an outer surface of the case; and a conductive via formed within the via hole and electrically connecting the at least one conductive pattern to a board inside the case.

12 Claims, 5 Drawing Sheets

CASE STRUCTURE HAVING CONDUCTIVE PATTERN AND METHOD OF MANUFACTURING THE SAME

CROSS-REFERENCE TO RELATED APPLICATIONS

This application claims the priority of Korean Patent Application No. 2007-0084429 filed on Aug. 22, 2007, in the Korean Intellectual Property Office, the disclosure of which is incorporated herein by reference.

BACKGROUND OF THE INVENTION

1. Field of the Invention

The present invention relates to case structures and a method of manufacturing the same, and more particularly, to a case structure having a conductive pattern formed at a surface thereof that can be electrically connected to a board inside the case, and a method of manufacturing the same.

2. Description of the Related Art

Recently, mobile communication terminals, such as a GPS, a PDA, a cellular phone, and a wireless laptop computer, have put into widespread use. Correspondingly, there is a need for small, lightweight, and thin mobile communication terminals. In order to satisfy the need, efforts have been made to reduce the volume of the mobile communication terminal with various functions. In particular, an antenna, which is one of the most important elements of the mobile communication terminal, needs to be reduced in size.

In general, among antennas of mobile communication terminals, external antennas, such as a rod antenna and a helical antenna, protrude from the outside of the mobile terminal by a predetermined distance, which prevents a reduction in size and portability of the mobile terminal. Further, when the mobile communication terminal drops, the external antenna may be damaged.

On the other hand, internal antennas, such as a surface mounted chip antenna, which are mounted on the inside of the mobile communication terminals, may be less damaged. However, a physical size of the internal antenna makes it difficult to reduce the size of the mobile communication terminal.

SUMMARY OF THE INVENTION

An aspect of the present invention provides a case structure having a conductive pattern, a method of manufacturing the same, and a method of forming the conductive pattern on the case.

According to an aspect of the present invention, there is provided a case structure having a conductive pattern, the case structure including: a case having at least one via hole formed therein; at least conductive pattern formed on an outer surface of the case; and a conductive via formed within the via hole and electrically connecting the at least one conductive pattern to a board inside the case.

A portion of the outer surface of the case where the conductive pattern is formed, and a wall surface of the via hole where the conductive via may be formed may be formed of a platable material.

The case may include a protrusion protruding toward the board mounted on the inside of the case, and the via hole may be formed in the protrusion.

The at least one conductive pattern may include an antenna pattern.

The conductive via may have one end exposed to the inner surface of the case.

The conductive via and the conductive pattern electrically connected to each other may be formed integrally with each other.

According to another aspect of the present invention, there is provided a method of manufacturing a case structure having a conductive pattern, the method including: forming a case having at least one via hole formed therein; forming a conductive via within the at least one via hole; and forming at least one conductive pattern on an outer surface of the case so that the conductive pattern is connected to the conductive via.

The forming a case may include: performing injection molding to form a first region that is a portion of the case by using a non-platable material; and performing injection molding to form a second region at a portion of the first region by a platable material.

A portion of the outer surface of the case where the conductive pattern is be formed, and a wall surface of the via hole where the conductive via is formed may be injection-molded by using the platable material.

The forming a conductive via and the forming at least one conductive pattern may include plating the second region.

The forming a conductive via and the forming at least one conductive pattern may be performed at the same time.

The forming a conductive via may include plating the wall surface of the via hole.

The forming at least one conductive pattern may include: forming a plating film on the outer surface of the case; and removing a portion of the plating film.

The forming a plating film on the outer surface of the case may be performed at the same time as the forming a conductive via, and the forming a conductive via may include plating the wall surface of the via hole.

The removing a portion of the plating film may be performed by a cutting process or an etching process.

According to still another aspect of the present invention, there is provided a method of forming a case structure having a conductive pattern, the method including: forming a case; forming a plating film on at least one surface of the case; and removing a portion of the plating film to form at least one conductive pattern.

The at least one conductive pattern may include an antenna pattern.

The removing a portion of the plating film may be performed by using a cutting process or an etching process.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 1A:
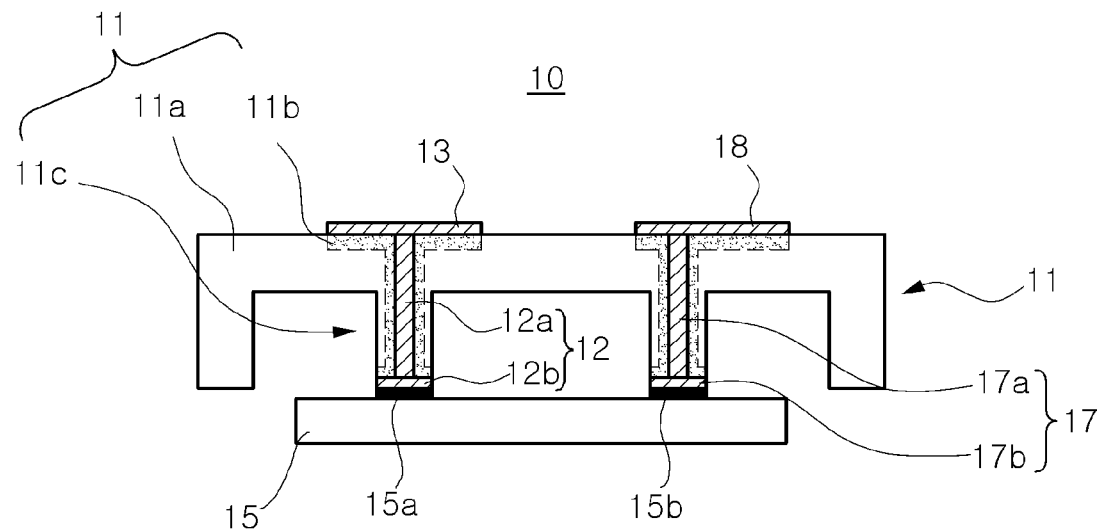
FIG. 1A is a cross-sectional view illustrating a case structure having a conductive pattern according to an exemplary embodiment of the present invention.
Figure 1B:
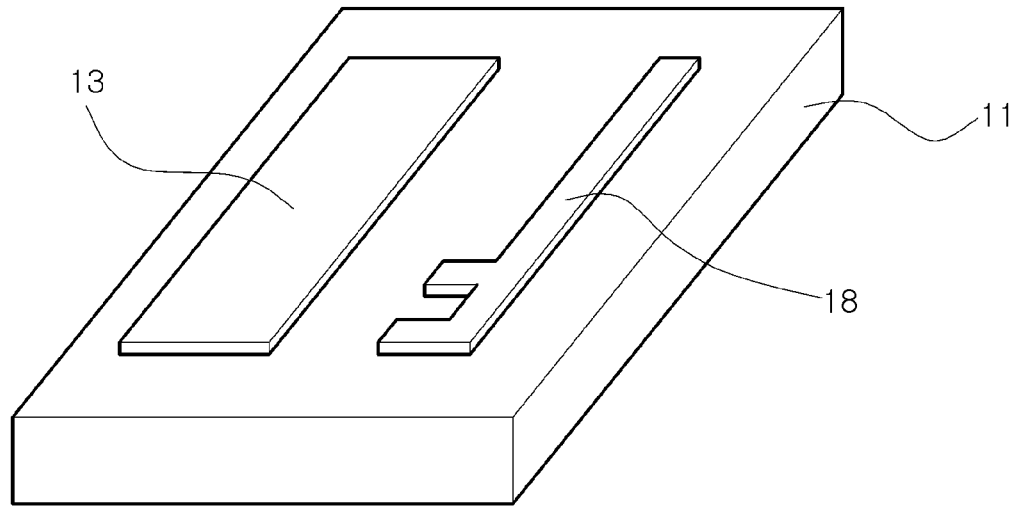
FIG. 1B is a perspective view illustrating the case structure having a conductive pattern according to the exemplary embodiment of the present invention.

FIG. 1A is a cross-sectional view illustrating a case structure having a conductive pattern according to an exemplary embodiment of the present invention. FIG. 1B is a perspective view illustrating the case structure having a conductive pattern according to the exemplary embodiment of the present invention.

Referring to FIGS. 1A and 1B, a case structure according to the embodiment of the invention may include a case 11, conductive vias 12 and 17, and conductive patterns 13 and 18.

The case 11 may be a case of a mobile communication terminal. In this embodiment, one side of the case of the mobile communication terminal is only shown.

One or more via holes that pass through the inside and outside of the case 11 may be formed in the case 11. Conductive vias are formed within the via holes to electrically connect the conductive patterns 13 and 18 formed on an outer surface of the case 11 to a board 15 that is mounted on the inside of the case 11.

In this embodiment, a protrusion 11c is formed on an inner surface of the case 11, and the protrusion 11c protrudes toward the board 15 that is mounted on the inside of the case 11. The via hole may be formed in the protrusion 11c. The protrusion 11c has a predetermined length corresponding to space between the inner surface of the case and the board mounted on the inside of the case, such that the protrusion 11c facilitates electrical connection between the conductive via formed in the case and the board.

In this embodiment, the case 11 may include a non-platable region 11a and a platable region 11b. The platable region 11b may be formed at a portion of the outer surface of the case and a wall surface of the via hole. Therefore, the conductive patterns 13 and 18 and the conductive vias 12 and 17 can be formed on the platable region 11b. The case 11 divided into the platable region 11a and the non-platable region 11b can be formed by dual injection molding.

At least one conductive pattern may be formed on the outer surface of the case 11. The conductive patterns 13 and 18 may be antenna patterns, ground patterns, or electromagnetic interference shielding patterns.

In this embodiment, two conductive patterns 13 and 18 are formed. One conductive pattern 13 may be an electromagnetic interference shielding pattern, and the other conductive pattern 18 may be an inverted F antenna pattern.

The method of forming the conductive patterns on the outer surface of the case may be variously implemented. A conductor film having a desired conductive pattern is attached to the outer surface of the case, or the outer surface of the case is directly plated, thereby forming the conductive patterns. The conductive patterns formed on the outer surface of the case can be electrically connected to the board mounted on the inside of the case by the conductive vias 12 and 17 formed within the via holes of the case.

At least one via hole that passes through the inner and outer surfaces of the case 11 may be formed in the case 11. The conductive vias 12 and 17 may be formed within the via holes. The conductive vias 12 and 17 can provide electrical connection between the board 15 mounted on the inside of the inside of the case 11 and the conductive patterns 13 and 18 formed on the outside of the case 11.

The conductive vias 12 and 17 may be formed by plating the wall surfaces of the via holes of the case. Here, one set of ends of the conductive vias 12 and 17 may contact the conductive patterns 13 and 18 formed on the outer surface of the case, respectively, and other sets of ends 12b and 17b thereof may be exposed to the inner surface of the case and thus contact electrodes 15a and 15b of the board, respectively.

When forming the conductive patterns and the conductive vias, if a plating method is used, the conductive patterns may be integrally formed with the conductive vias connected to the conductive patterns. That is, when forming the case, a dual injection molding process may be performed so that the wall surfaces of the via holes and a region where the conductive patterns will be formed are formed by using a platable material. When the case manufactured using the dual injection molding process is immersed in a plating solution, the platable region is only plated with the material. That is, the partial region of the outer surface of the case and the wall surfaces of the via holes are only plated. Therefore, the conductive patterns formed on the outer surface of the case can be integrally formed with the conductive vias. In this way, when the conductive patterns and the conductive vias are integrally formed with each other, loose contact between the conductive patterns and the conductive vias can be prevented.

Figure 2A:
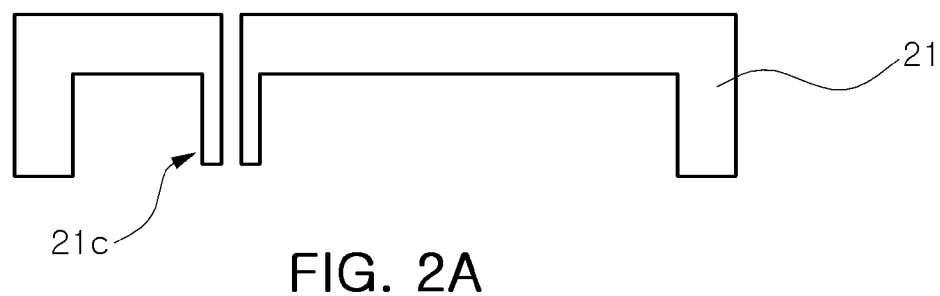
FIGS. 2A to 2C are cross-sectional views of the process flow illustrating a method of manufacturing a case structure having a conductive pattern according to another exemplary embodiment of the present invention.
Figure 2B:
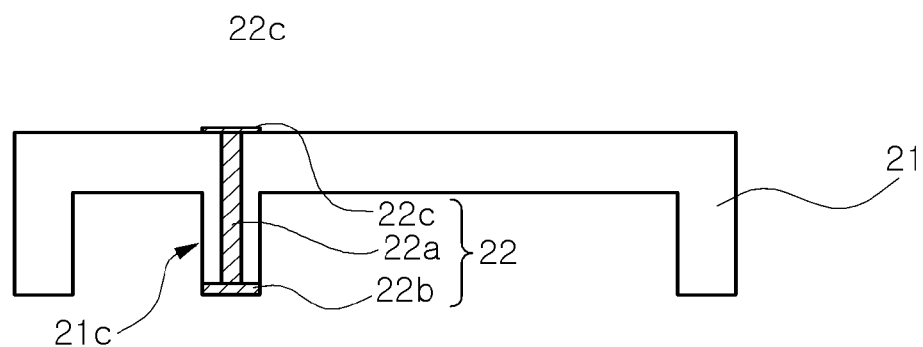
Figure 2C:
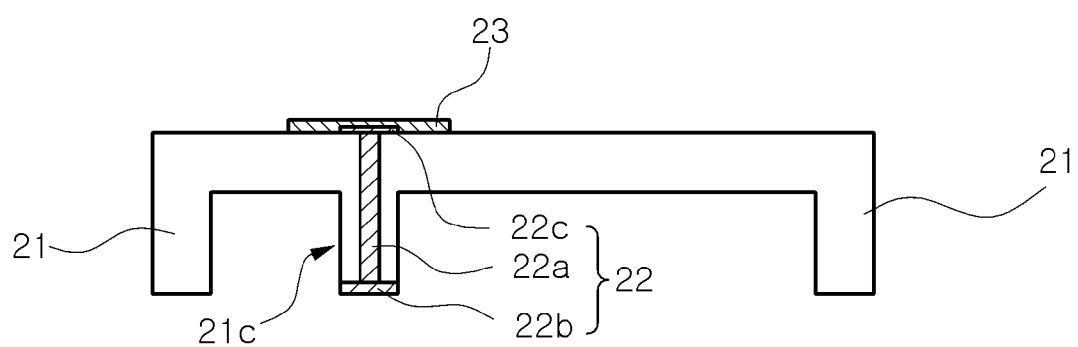

FIGS. 2A to 2C are cross-sectional views illustrating the process flow for manufacturing a case structure having a conductive pattern according to an exemplary embodiment of the present invention.

In FIG. 2A, a case 21 is manufactured.

At least one via hole that passes through an inner surface and an outer surface of the case 21 may be formed in the case 21. A conductive via is formed within the via hole to electrically connect a conductive pattern formed on the outer surface of the case to a board inside the case 21.

In this embodiment, a protrusion 21c that protrudes toward the board to be mounted on the inside of the case is formed on the inner surface of the case. The via hole may be formed in the protrusion 21c. The protrusion 21c has a predetermined length corresponding to space between the inner surface of the case and the board mounted to the case to thereby facilitate electrical connection between the conductive via formed in the case 21 and the board.

The case 21 may be formed by an injection molding process. In this embodiment, the case may be injection-molded by using a platable material.

In FIG. 2B, a conductive via 22 is formed within the via hole of the case 21.

A portion 22a of the conductive via 22 is formed along a wall surface of the via hole. Both ends 22b and 22c of the conductive via may be exposed to the inner and outer surfaces of the case, respectively. One end 22c that is exposed to the outer surface of the case may contact the conductive pattern formed on the outer surface of the case. The other end 22b exposed to the inner surface of the case may contact an electrode of the board mounted on the inside of the case.

The process of forming the conductive via 22 may be performed by a plating process. The wall surface of the via hole of the case may be plated with a conductive material according to the plating process to form both ends of the conductive via.

In FIG. 2C, a conductive pattern 23 is formed on the outer surface of the case 21.

The conductive pattern 23 may be an antenna pattern, a ground pattern, or an electromagnetic interference shielding pattern.

A method of forming the conductive pattern 23 may be variously implemented. That is, the conductive pattern is formed by attaching a film conductive pattern to the outer surface of the case 21 so that the film conductive pattern may contact the conductive via 22.

Further, the conductive pattern may be formed by plating. When the conductive pattern 23 is formed by plating, the plating process is performed at the same time when the conductive via 22 is formed, so that the conductive via 22 and the conductive pattern 23 can be formed integrally with each other. As such, when the conductive via and the conductive pattern are formed integrally with each other, loose contact between the conductive pattern and the conductive via can be prevented to thereby increase product reliability.

Figure 3A:
FIG. 3A to 3C are cross-sectional views of the process flow illustrating a method of manufacturing a case structure having a conductive pattern according to still another exemplary embodiment of the present invention.
Figure 3B:
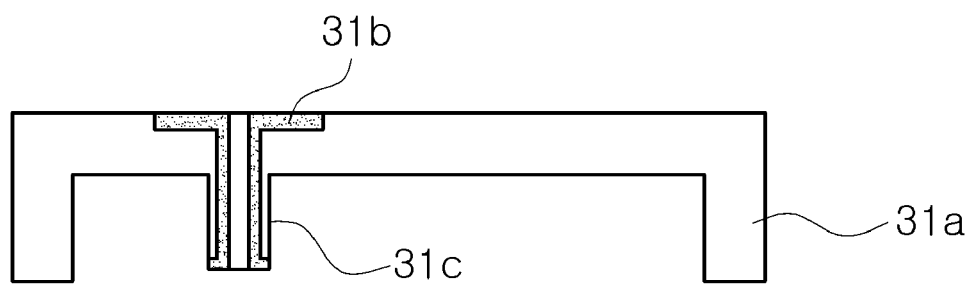
Figure 3C:
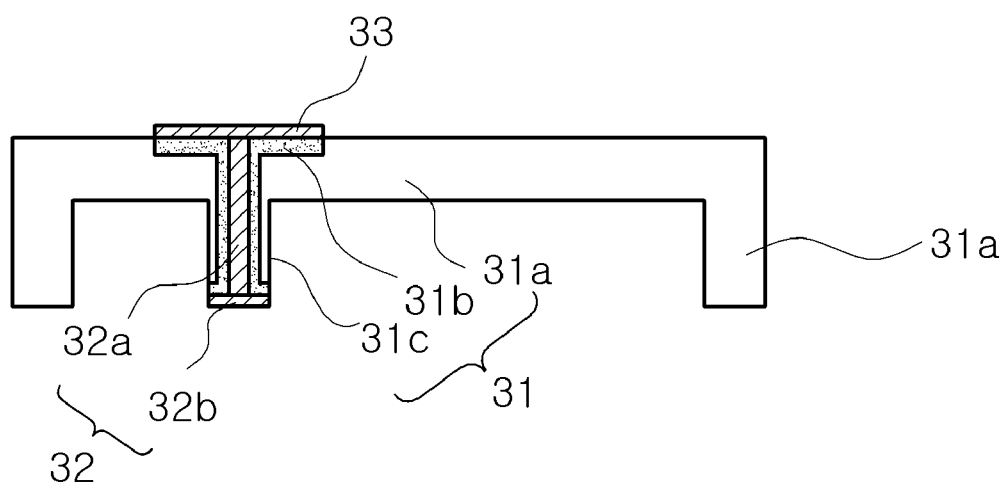

FIGS. 3A to 3C are cross-sectional views of the process flow illustrating a method of manufacturing a case structure having a conductive pattern according to another exemplary embodiment of the present invention.

In this embodiment, a case 31 can be formed by dual injection molding. In FIG. 3A, a first region 31a that is part of the case may be formed by using a non-platable material. Here, the part of the case may be formed while leaving space for a conductive pattern 33 to be formed on the case and a region to contact a conductive via 32.

As shown in FIG. 3B, a second region 31b may be formed on the space left in the first region 31a of the case by using a platable material. That is, injection molding may be performed by using the platable material to form the second region 31b according to the shape of the conductive pattern to be formed on an outer surface of the case, and a wall surface of the via hole.

In FIG. 3C, the conductive pattern and the conductive via hole are formed on the case.

The surface of the case 31 that is formed by dual injection molding is divided into a platable region 31b and a non-platable region 31a. By immersing the case 31 in a plating solution, the conductive pattern 33 and the conductive via 32 can be formed on the platable region 31b.

In this embodiment, since the conductive pattern 33 and the conductive via 32 may be formed by the same plating process, the conductive pattern 33 and the conductive via 32 may be formed integrally with each other. As such, since the conductive pattern 33 and the conductive via 32 are formed integrally with each other, loose contact therebetween can be prevented to thereby increase product reliability.

The number of conductive patterns and the shape thereof may be varied. When a plurality of antenna patterns are formed, a multi-band antenna that can operate according to signals having different frequency bands can be easily implemented.

Figure 4A:
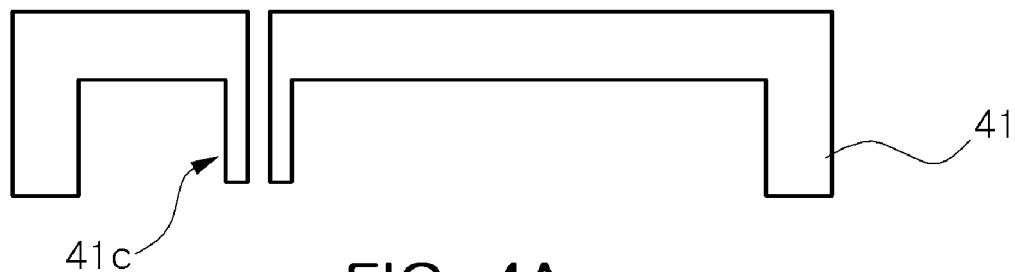
FIG. 4A to 4C are cross-sectional views of the process flow illustrating a method of manufacturing a case structure having a conductive pattern according to yet another exemplary embodiment of the present invention.
Figure 4B:
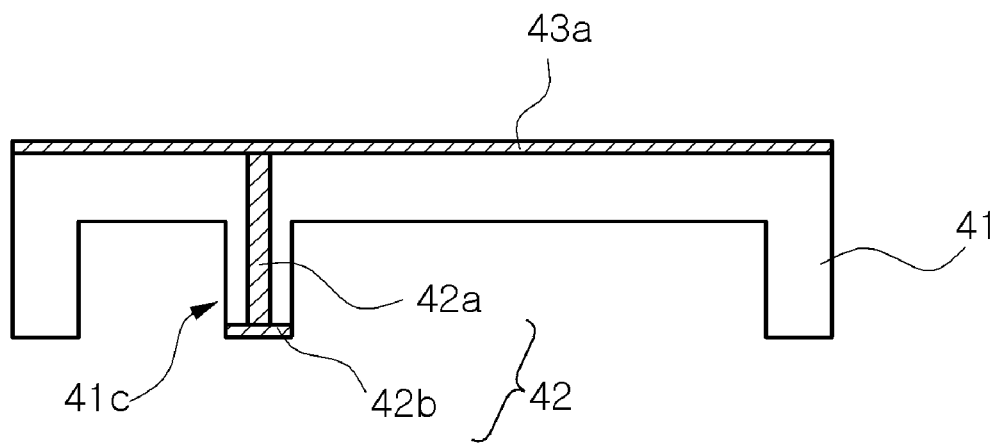
Figure 4C:
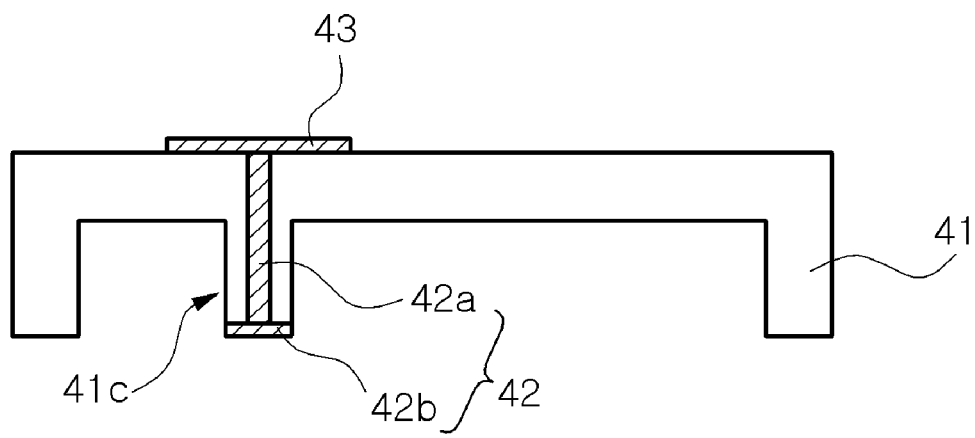

FIGS. 4A to 4C are cross-sectional views of the process flow illustrating a method of manufacturing a case structure having a conductive pattern according to still another embodiment of the present invention.

In FIG. 4A, a case 41 is manufactured. At least one via hole that passes through inner and outer surfaces of the case 41 may be formed in the case 41. A conductive via is formed within the via hole to provide electrical connection between a conductive pattern formed on the outer surface of the case and a board inside the case.

In this embodiment, a projection 41c that protrudes toward the board mounted on the inside of the case is formed on the inner surface of the case. The via hole may be formed in the projection 41c. The projection 41c has a length corresponding to space between the inner surface of the case and the board mounted on the inside of the case, such that the projection 41c facilitates electrical connection between the conductive via formed on the case 41 and the board.

In FIG. 4B, plating is performed on the via hole and the entire outer surface.

When plating is performed on the via hole of the case, a conductive via 42 is formed. The outer surface of the case may be plated to form the conductive film 43a, which then may be processed into a conductive pattern according to the following process.

When the via hole and the outer surface of the case 41 are plated, the via hole and the outer surface may be plated at the same time by the same plating process. Alternatively, the via hole and the outer surface may be plated according to different plating processes.

In this embodiment, the via hole and the outer surface of the case 41 may be plated by the same plating process. When the conductive via 42 and the conductive film 43a are formed by the same plating process like this embodiment, the conductive pattern to be formed by processing the conductive film 43a and the conductive via 42 can be formed integrally with each other, thereby preventing loose contact and increasing product reliability.

In this embodiment, one end 42b of the conductive via may be exposed to the inner surface of the case. As such, by exposing one end of the conductive via to the inner surface of the case, contact between a board mounted on the inside of the case and the conductive via can be improved.

In FIG. 4C, a conductive pattern 43 is formed by partially removing the conductive film 43a formed on the outer surface of the case.

In FIG. 4C, a potion of the conductive film 43a formed on the outer surface of the case is removed to form the conductive pattern 43 having a desired pattern. In this embodiment, one conductive pattern is only formed. However, when a plurality of via holes are formed in the case, a plurality of vias or a plurality of conductive patterns may be formed. When a plurality of conductive patterns are formed, the conductive patterns may be antenna patterns, ground patterns, or electromagnetic interference shielding patterns. Further, when a plurality of antenna patterns having different patterns are formed on the outer surface of the case according to this process, a multi-band antenna that can operate according to signals having different frequency bands can be easily implemented.

A process of processing the conductive film to form the conductive pattern can be variously implemented.

That is, the portion of the conductive film 43a can be removed by cutting the conductive film 43a. The conductive film 43a may be cut by using a laser.

Further, an etching process may be performed on the conductive film 43a. That is, a photo resist film having a desired conductive pattern shape may be formed on the conductive film 43a, parts of the conductive film where the photo resist is not formed may be etched by using an etchant, and then the photo resist film is removed. In this way, the conductive pattern having the desired shape is only left on the outer surface of the case.

Figure 5A:
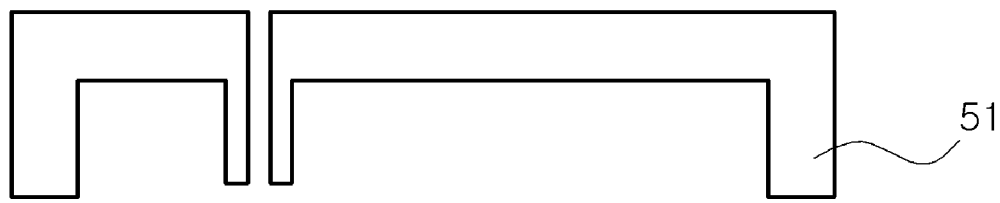
FIGS. 5A to 5C are cross-sectional views of the process flow illustrating a method of manufacturing a case structure having a conductive pattern according to another exemplary embodiment of the present invention.
Figure 5B:
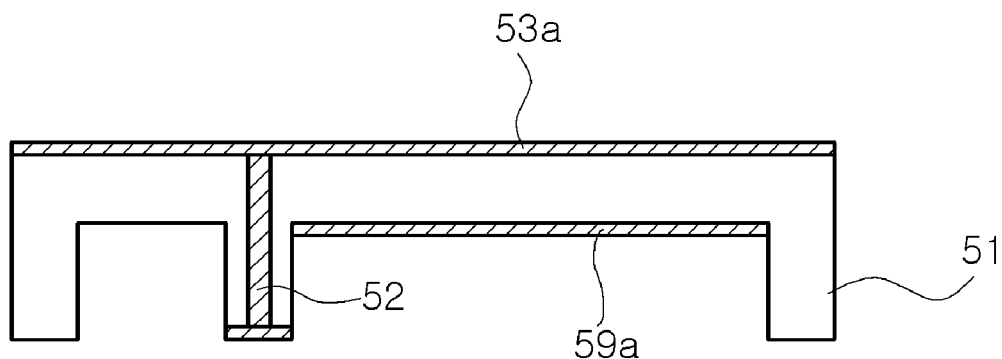
Figure 5C:
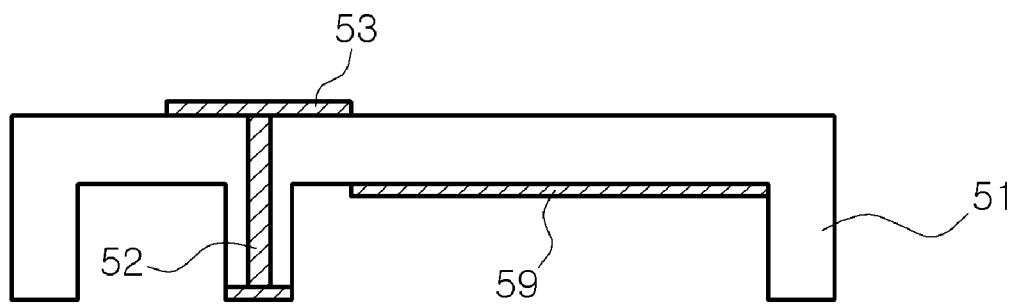

In FIGS. 5A to 5C, a process of manufacturing a case structure having a conductive pattern according to yet another exemplary embodiment of the present invention.

In FIG. 5A, a case 51 is manufactured. At least one via hole that passes through inner and outer surfaces of the case 51 may be formed in the case 51. A conductive via is formed in the via hole, and provides electrical contact between conductive patterns formed on the outer surface of the case and a board inside the case.

In FIG. 5B, conductive films 53a and 59a are formed on the outer surface and the inner surface of the case, respectively.

The conductive films 53a and 59a may be formed by a plating process. In this embodiment, the conductive films are formed on the inner surface and the outer surface of the case. However, the conductive film may be formed at least one surface of the case.

In this embodiment, a wall surface of a via hole of the case 51 is plated in a plating process of forming the conductive films 53a and 59a. In this embodiment, a conductive via 52 formed within the via hole can electrically connect the first conductive film 53a to a board inside the case. Since the second conductive film 59a is formed on the inner surface of the case, the first conductive film 59a can be electrically connected to the board mounted on the inside of the case.

In FIG. 5C, conductive patterns 53 and 59 are formed by partially removing the conductive films 53a and 59a formed on the outer surface and the inner surface of the case.

In this embodiment, one conductive pattern is formed on each of the outer surface and the inner surface of the case. However, the number of conductive patterns that are formed on the inner and outer surfaces of the case may be varied. When a plurality of conductive patterns are formed, the conductive patterns may be antenna patterns, ground patterns, or electromagnetic interference shielding patterns. Further, when a plurality of different antenna patterns are formed on the inner and outer surfaces of the case according to this process, a multi-band antenna that can operate according to signals having different frequency bands can be easily implemented.

The process of processing the conductive films to form the conductive patterns can be performed by using various kinds of methods.

That is, parts of the conductive films 53a and 59a can be removed by cutting the conductive films 53a and 59a. The conductive films 53a and 59a may be cut by using a laser.

Further, an etching process may be performed on the conductive films 53a and 59a. That is, photo resist films having a desired conductive pattern shape are coated on the conductive films 53a and 59a, parts of the conductive films where the photo resist films are not coated are etched by using an etchant, and then, the photo resist films are removed. In this way, the conductive patterns having the desired shape are only left on the outer surface of the case.

As set forth above, according to the exemplary embodiments of the invention, a case structure having a conductive pattern can easily make electrical contact between the conductive pattern and a board inside the case structure, has high reliability, and can form conductive patterns having various shapes.

While the present invention has been shown and described in connection with the exemplary embodiments, it will be apparent to those skilled in the art that modifications and variations can be made without departing from the spirit and scope of the invention as defined by the appended claims.

What is claimed is:

1. A case structure comprising:
    a case having at least one via hole formed therein;
    at least one conductive pattern formed on a region of an outer surface of the case; and
    a conductive via formed within the via hole and electrically connecting the at least one conductive pattern to a board inside the case;
    wherein said cases comprises
    a first portion formed of a platable material and defining (i) the region of the outer surface on which the at least one conductive pattern is formed and (ii) a wall surface of the via hole in which the conductive via is formed, and
    a second portion formed of a non-platable material and other than the first portion.

2. The case structure of claim 1, wherein the case comprises a protrusion protruding toward the board mounted on the inside of the case, and
    the via hole is formed in the protrusion.

3. The case structure of claim 1, wherein the at least one conductive pattern comprises an antenna pattern.

4. The case structure of claim 1, wherein the conductive via has one end exposed to an inner surface of the case.

5. The case structure of claim 1, wherein the conductive via and the conductive pattern electrically connected to each other are formed integrally with each other.

6. A method of manufacturing a case structure, the method comprising:
    forming a case having at least one via hole formed therein;
    forming a conductive via within the at least one via hole; and
    forming at least one conductive pattern on a region of an outer surface of the case so that the conductive pattern is connected to the conductive via;
    wherein the formation of the case comprises:
    performing injection molding to form a first portion of the case from a platable material, the first portion defining (i) the region of the outer surface on which the at least one conductive pattern is formed and (ii) a wall surface of the via hole in which the conductive via is formed; and
    performing injection molding to form a second portion of the case from a non-platable material, said second portion being other than the first portion.

7. The method of claim 6, wherein the formations of the conductive via and the at least one conductive pattern comprise plating the first portion with conductive material.

8. The method of claim 7, wherein the formations of the conductive via and the at least one conductive pattern are performed at the same time.

9. The method of claim 6, wherein the formation of the conductive via comprises plating the wall surface of the via hole with conductive material.

10. The method of claim 6, wherein the formation of the at least one conductive pattern comprises:
    forming a plating film on the outer surface of the case; and
    removing a portion of the plating film outside said region.

11. The method of claim 10, wherein
    the formation of the plating film on the outer surface of the case is performed at the same time as the formation of the conductive via, and
    the formation of the conductive via comprises plating the wall surface of the via hole with said plating film.

12. The method of claim 10, wherein the portion of the plating film is removed by a cutting process or an etching process.

* * * * *